United States Patent [19]
Yamauchi

[11] Patent Number: 5,303,186
[45] Date of Patent: Apr. 12, 1994

[54] SEMICONDUCTOR MEMORY AND PROCESS FOR MANUFACTURING THE SAME

[75] Inventor: Yoshimitsu Yamauchi, Yamatokoriyama, Japan

[73] Assignee: Sharp Kabushiki Kaisha, Osaka, Japan

[21] Appl. No.: 963,758

[22] Filed: Oct. 20, 1992

[30] Foreign Application Priority Data

Dec. 26, 1991 [JP] Japan .................................. 3-345115

[51] Int. Cl.$^5$ ........................................... G11C 13/00
[52] U.S. Cl. ................ 365/185; 365/189.01; 365/149
[58] Field of Search .............. 365/230.01, 149, 189.01, 365/185

[56] References Cited

U.S. PATENT DOCUMENTS 5,210,597  5/1993  Kakiuchi et al. .................. 365/185

Primary Examiner—Terrell W. Fears
Attorney, Agent, or Firm—Nixon & Vanderhye

[57] ABSTRACT

A semiconductor memory comprises a plurality of non-volatile DRAMs and volatile DRAMs overlaying an identical semiconductor substrate, each of the non-volatile DRAMs comprising a word select transistor having a word selective gate electrode, a recall transistor having a recall gate electrode, a Flotox type memory transistor having a floating gate electrode and a capacitor having a storage node and a capacitor electrode, and each of the volatile DRAMs comprising a select transistor having a selective gate electrode and a capacitor having a capacitor lower electrode, a storage node and a capacitor upper electrode; the word selective gate electrode, the recall gate electrode and the floating gate electrode in the non-volatile DRAM and the selective gate electrode and the capacitor lower electrode in the volatile DRAM being formed of a first conductive layer on the semiconductor substrate, the storage nodes in the non-volatile DRAM and volatile DRAM being formed of a second conductive layer on the first conductive layer, the capacitor electrode in the non-volatile DRAM and the capacitor upper electrode in the volatile DRAM being formed of a third conductive layer on the second conductive layer, and any of the lower electrode and the upper electrode being common to a lower electrode and a upper electrode in their adjacent cells.

3 Claims, 3 Drawing Sheets

SEMICONDUCTOR MEMORY AND PROCESS FOR MANUFACTURING THE SAME

BACKGROUND OF THE INVENTION

1. Field of the Invention

The present invention relates to a semiconductor memory and a process for manufacturing the same, and more particularly to a semiconductor memory used as a main memory provided on a group of small size personal apparatuses such as notebook-type computers, notebook-type word processors and handy terminals of palm top personal computers and to a process for manufacturing the same.

2. Description of the Prior Art

Conventional main memories incorporated in small-size personal apparatuses have been manufactured by forming a mask ROM and a RAM into one chip to be provided thereon.

Programming mask ROMs on the development stage involves considerable inconvenience for users such as prolonged period of development and the impossibility of revising data.

Although forming an EEPROM and a RAM into one chip to be provided on systems for electrically erasing and writing in data without programming on the development stage is reported, EEPROMs have such drawbacks as limited time of rewriting data and considerable time required for one cycle of rewriting (10 msec/cell), thereby making it very difficult to provide a large capacity.

SUMMARY OF THE INVENTION

The present invention provides a semiconductor memory comprising a plurality of non-volatile DRAMs and volatile DRAMs overlaying an identical semiconductor substrate, each of the non-volatile DRAMs comprising a word select transistor having a word selective gate electrode, a recall transistor having a recall gate electrode, a Flotox type memory transistor having a floating gate electrode and a capacitor having a storage node and a capacitor electrode, and each of the volatile DRAMs comprising a select transistor having a selective gate electrode and a capacitor having a capacitor lower electrode, a storage node and a capacitor upper electrode;

the word selective gate electrode, the recall gate electrode and the floating gate electrode in the non-volatile DRAM and the selective gate electrode and the capacitor lower electrode in the volatile DRAM being formed of a first conductive layer on the semiconductor substrate, the storage nodes in the non-volatile DRAM and volatile DRAM being formed of a second conductive layer on the first conductive layer, the capacitor electrode in the non-volatile DRAM and the capacitor upper electrode in the volatile DRAM being formed of a third conductive layer on the second conductive layer, and any of the lower electrode and the upper electrode being common to a lower electrode and a upper electrode in their adjacent cells.

Moreover, the present invention also provides a process for manufacturing the semiconductor memory which comprises (i) depositing the first conductive layer on the substrate with a gate insulating film sandwiched therebetween for patterning the first conductive layer to form simultaneously the word selective gate electrode, the recall gate electrode and the floating gate electrode in the non-volatile DRAM, as well as the selective gate electrode and the capacitor lower electrode in the volatile DRAM, (ii) depositing the second conductive layer on the word selective gate electrode, the recall gate electrode, and the floating gate electrode in the non-volatile DRAM, as well as the selective gate electrode and the capacitor lower electrode in the volatile DRAM with a first insulating film sandwiched therebetween for patterning the second conductive layer to form simultaneously the storage nodes in the non-volatile DRAM and the volatile DRAM, (iii) depositing the third conductive layer on the storage nodes in the non-volatile DRAM and the volatile DRAM with a second insulating film sandwiched therebetween for patterning the third conductive layer to form simultaneously the capacitor electrode in the non-volatile DRAM and the capacitor upper electrode constituting the volatile DRAM.

PREFERRED EMBODIMENT OF THE INVENTION

Figure 1:
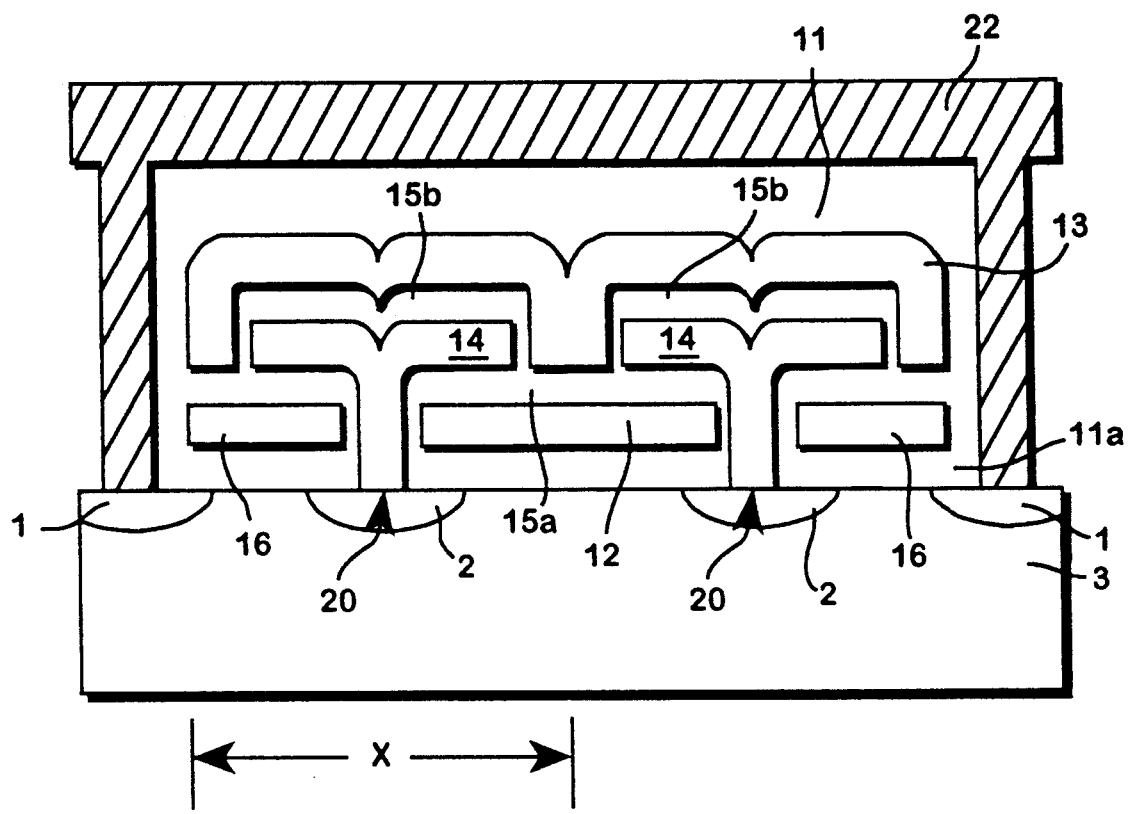
FIG. 1 is a schematic sectional view illustrating an embodiment of the volatile DRAM of the present invention.

The present invention provides a construction of and a method for simultaneously forming into one chip, a non-volatile DRAM comprising a word select transistor, a recall transistor, a Flotox type memory transistor and a capacitor as well as a volatile DRAM (standard DRAM) comprising a select transistor and a capacitor to be provided on a semiconductor memory. The word select transistor is constituted of a word selective gate electrode. The recall transistor is constituted of a recall gate electrode. The Flotox type memory transistor is constitute of a floating gate electrode and the capacitor is constituted of a capacitor electrode and a storage node. The select transistor constituted of a selective gate electrode and the capacitor constituted of a capacitor lower electrode and a capacitor upper electrode. The non-volatile DRAM is constituted by connecting in series the word select transistor, the recall transistor and the Flotox type memory transistor.

The non-volatile DRAM functioning as EEPROM and DRAM has approximately identical cell area with EEPROM. Besides, when the DRAM is operated, the non-volatile and the standard DRAMs can be used as the same device without distinction. In addition, data can be revised at a high speed of 50 nsec/cell. Data in the non-volatile DRAM unit can be stored even after the power source is turned off. The total capacity of DRAM can be made very large by forming the capacitor lower and upper electrodes of the volatile DRAM on the both sides of the storage node.

The semiconductor substrate to be used in the present invention is preferably formed of silicon though it can be formed of any material that can be used for substrates.

The word selective gate electrode, the recall gate electrode and the floating gate electrode which constitute the non-volatile DRAM as well as the selective gate electrode and capacitor lower electrode which constitute the volatile DRAM are simultaneously formed of a first conductive layer. The first conductive layer may use silicide, polycide or the like material, preferably polysilicon. Besides, they are preferably formed in the thickness of approximately 1000 to 3000 Å. The first conductivity layer may be deposited by a conventional method, for example, CVD (Chemical Vapor Deposition) method, MBE (Molecular Beam Epitaxy) method or the like. The first conductive layer may be patterned by a conventional method, for example, photolithographic process or the like, to provide the above mentioned gate electrodes.

The word selective gate electrode, the recall gate electrode, the floating gate electrode in the non-volatile DRAM and the capacitor lower electrode and the selective gate electrode in the volatile DRAM are arranged on the substrate respectively with an about 100 to 400 Å thick gate insulating film such as, for example, $SiO_2$ film sandwiched therebetween. On a portion of the gate insulating film just below the floating gate electrode, a tunnel insulating film, for example, a $SiO_2$ film is arranged in the thickness of approximately 70 to 120 Å. The gate insulating film and the tunnel insulating film may be formed by a conventional method, for example, thermal oxidation, CVD method or the like.

On the word selective gate electrode, the recall gate electrode and the floating gate electrode in the non-volatile DRAM as well as the capacitor lower electrode and the selective gate electrode in the volatile DRAM, an first insulating film is formed. The first insulating film may be formed of $SiO_2$ film, but preferably formed of a laminated film of $SiN/SiO_2$ or $SiO_2/SiN/SiO_2$. The thickness of the film can preferably be 100 to 200 Å in terms of $SiO_2$ film. Besides, it may be formed of ferroelectric film such as PZT and PLZT.

Furthermore, the storage nodes of the capacitor in the non-volatile DRAM and the volatile DRAM are simultaneously formed of a second conductive layer on the first insulating film. The second conductive layer may use silicide, polycide or the like material, preferably polysilicon. Besides, they are preferably formed in the thickness of approximately 500 to 2500 Å.

On the storage nodes of the capacitor in the non-volatile DRAM and the volatile DRAM, an second insulating film is formed. The second insulating film may be formed of $SiO_2$ film, but preferably formed of a laminated film of $SiN/SiO_2$ or $SiO_2/SiN/SiO_2$. The thickness of the film can preferably be 100 to 200 Å in terms of $SiO_2$ film. Besides, it may be formed of ferroelectric film such as PZT and PLZT.

Furthermore, the capacitor electrode of the capacitor in the non-volatile DRAM as well as the capacitor upper electrode of the capacitor in the volatile DRAM are simultaneously formed of a third conductive layer on the second insulating film. The third conductive layer may use silicide, polycide or the like material, preferably polysilicon. Besides, they are preferably formed in the thickness of approximately 500 to 2500 Å.

Besides, the source and the drain in the non-volatile and the volatile DRAMs can be formed by ion implantation of P and As at 40 to 80 KeV and in the concentration of approximately $1 \times 10^{14}$ to $1 \times 10^{15}$ ions/cm$^2$.

In the volatile DRAM of the present invention, the storage node of the capacitor is connected through the diffusion layer (drain) of the select transistor. Then the capacitor lower electrode and the capacitor upper electrode are extended to the adjacent cell to form capacitor lower and upper electrodes which can also act for the adjacent cell.

By the way, one unit cell of the semiconductor memory which comprises the non-volatile DRAM and the volatile DRAM of the present invention is detailed here for the sake of argument. In actuality, a plurality of these unit cells are arranged to constitute these DRAMS. In addition, an n-channel MOS is detailed as a MOS transistor constituting the non-volatile and the volatile DRAM. The same concept holds true of a p-channel MOS. The same concept also constitutes the principle of the present invention.

An embodiment of the present invention is detailed with respect to the drawings.

Figure 6:
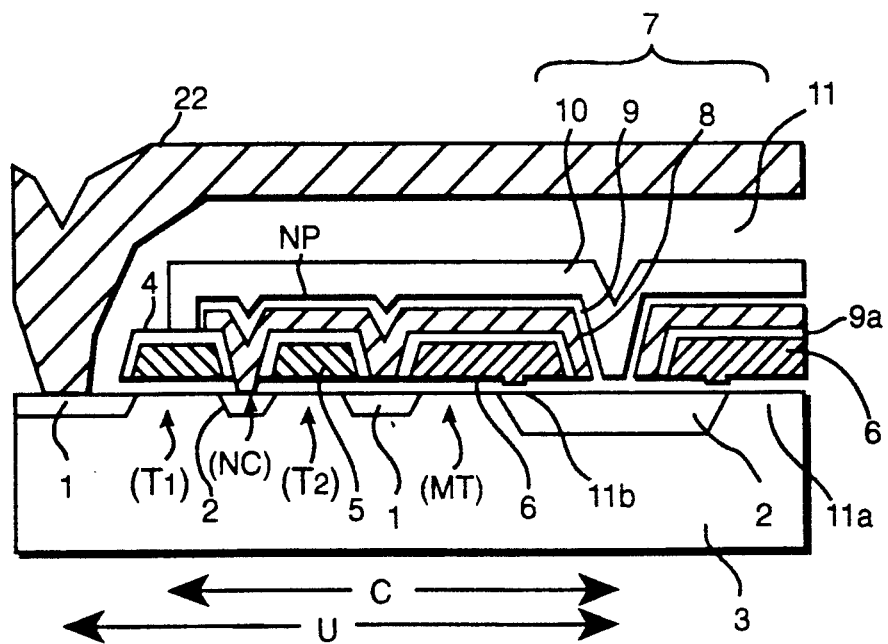
FIG. 6 is an illustrative view showing an embodiment of the non-volatile DRAM of the present invention.

FIGS. 1 and 6 show respectively the constructions of the volatile DRAM and non-volatile DRAM formed on the identical substrate included in the semiconductor of the present invention.

Referring initially to FIG. 1, a unit cell X of the volatile DRAM primarily comprises the select transistor and the capacitor. These devices are formed on a p-type Si substrate 3 having the $SiO_2$ film 11a functioning as a gate insulating film.

The select transistor is formed by mounting the selective gate electrode 16 on the Si substrate 3 having a drain 1 and a source 2.

The capacitor is constituted of the capacitor lower electrode 12 formed of the first conductive layer on the Si substrate 3 with the $SiO_2$ film 11a sandwiched therebetween, the SiN film 15a serving as a first insulating film formed on the selective gate electrode 16 and the capacitor lower electrode 12, the storage node 14 of the polysilicon formed of the second conductive layer on the SiN film 15a, the $SiO_2$ film 15b serving as a second capacitor insulating film formed on the storage node 14 and the capacitor upper electrode 13 formed of the third conductive layer on the $SiO_2$ film 15b. Then the storage node 14 is connected to the source 2 through a node contact 20. Besides, the capacitor lower electrode 12 and the capacitor upper electrode 13 also serve as the capacitor lower and upper electrodes 12, 13 formed in the adjacent cell.

A bit line 22 which is connected with the drain 1 of the select transistor is formed on the capacitor upper electrode 13 with an interlayer insulating film 11 sandwiched therebetween.

Figure 5:
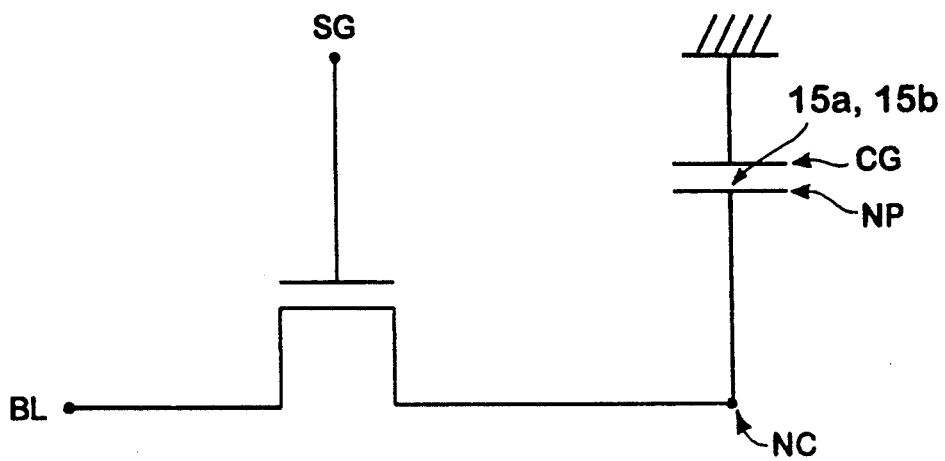
FIG. 5 is an illustrative view showing the construction of the fourth step in the method for manufacturing the volatile DRAM of the embodiment.

FIG. 5 also illustrates an equivalent circuit of the volatile DRAM thus constituted.

Referring now to FIG. 6, a unit cell U of the non-volatile DRAM primarily comprises the word select transistor $T_1$, the recall transistor $T_2$, the Flotox type memory transistor MT and the capacitor 7. These devices are formed on a p-type Si substrate 3 having $SiO_2$ film 11a as the gate insulating film.

The word select transistor $T_1$ is formed by mounting the word selective gate electrode 4 on the Si substrate 3 having a drain 1 and a source 2.

The recall transistor $T_2$ is formed by mounting the recall gate electrode 5 on the Si substrate 3 having a drain 1 and a source 2. The source 2 of the transistor $T_2$ is shared with the transistor $T_1$.

Besides, the transistor MT is formed by mounting the floating gate electrode 6 on the Si substrate 3 having a drain 1 and a source 2. On a portion of $SiO_2$ film 11a as the gate insulating film just below the floating gate electrode 6 provides a tunnel insulating film 11b thinly formed on the source 2. Then the drain 1 of the transistor MT is shared with the transistor $T_2$. The source 2 is shared with a floating gate electrode 6 of a transistor MT formed on the adjacent cell.

A capacitor area C is formed in such a manner that the word selective gate electrode 4, the recall gate electrode 5 and the floating gate electrode 6 are commonly covered. The capacitor 7 is constituted of the storage node 8 of the polysilicon film, the second insulating film formed as the capacitor insulating film 9 and the capacitor electrode 10 of the polysilicon film. The storage node 8 of the capacitor 7 is connected with the source 2 formed between the transistor $T_1$ and the transistor $T_2$. The capacitor electrode 10 of the capacitor 7 is shared with a capacitor electrode formed on the adjacent cell.

A bit line 22 which is connected with the drain 1 of the transistor $T_1$ are formed on the capacitor 7 with an interlayer insulating film 11 sandwiched therebetween.

Next, a process for manufacturing the above non-volatile and the volatile DRAM will be illustrated below with respect to FIGS. 2 to 4 as well as FIGS. 1 and 6.

Figure 2:
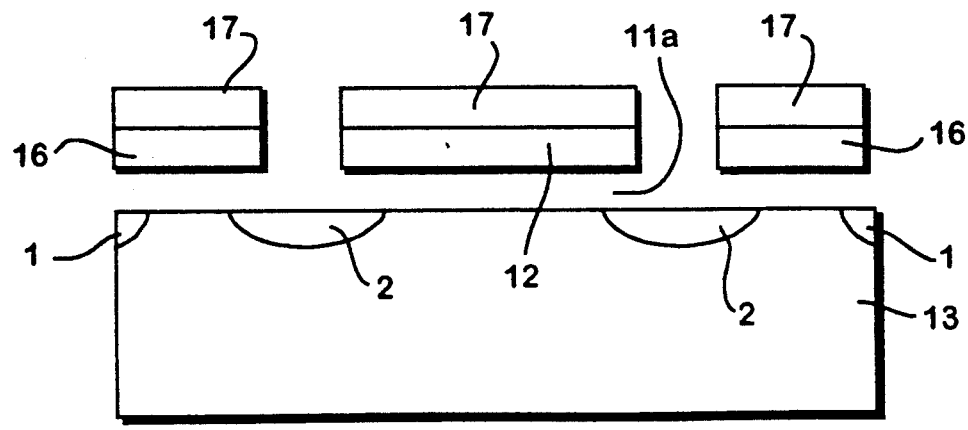
FIG. 2 is an illustrative view showing the construction of the first step in the method for manufacturing the volatile DRAM of the embodiment.

As shown in FIG. 2, at the outset, a device isolation film is formed on the P-type silicon substrate 3, on which the approximately 250 Å $SiO_2$ film 11a is formed all over the silicon substrate 3 as the gate insulating film, followed by forming the about 100 Å thick $SiO_2$ film 11b as the tunnel insulating film in a predetermined area. In the next process, on the silicon substrate 3, n-type impurities such as P and As are subject to ion implantation, for example, at 40 KeV and in the concentration of $1 \times 10^{14}$ ions/cm² to form the source 2 at a portion of area to be formed the floating gate electrode 6 later.

Subsequently, on $SiO_2$ film 11a, 11b, polysilicon is laminated to the thickness of approximately 3000 Å as the first conductive layer. Known etching technique using photolithographic process is applied for patterning to form the word selective gate electrode 4, the recall gate electrode 5 and the floating gate electrode 6 in the formation area of the non-volatile DRAM while forming the capacitor lower electrode 12 and the selective gate electrode 16 in the formation area of the volatile DRAM. At this point, a $SiO_2$ film 17 may be formed on the capacitor lower electrode 12 and the selective gate electrode 16. Then using as mask the word selective gate electrode 4, the recall gate electrode 5, the floating gate electrode 6, the capacitor lower electrode 12 and the selective gate electrode 16 allows, for example, an n-type impurities P to be subjected to ion implantation at 40 KeV and in the concentration of $1 \times 10^{14}$ ions/cm² to form the drain 1 and the source 2.

Figure 3:
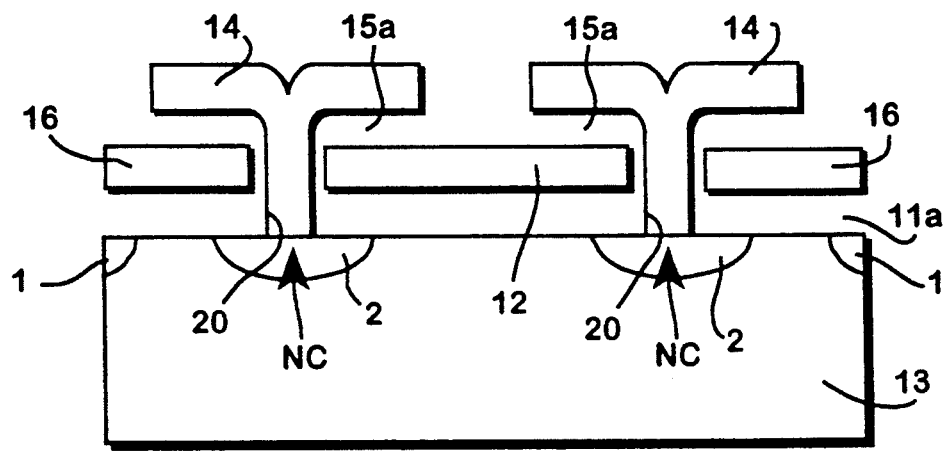
FIG. 3 is an illustrative view showing the construction of the second step in the method for manufacturing the volatile DRAM of the embodiment.

As shown in FIG. 3, when $SiO_2$ film 17 is formed on the capacitor lower electrode 12 and the selective gate electrode 16, the $SiO_2$ film 17 is removed with etching back technique before forming SiN films 9a, 15a as the first insulating film on the word selective gate electrode 4, the recall gate electrode 5, the floating gate electrode 6 and the capacitor lower electrode 12 and the selective gate electrode 16 to the thickness of approximately 150 Å. Then respectively on the source 2 shared by the word selective gate electrode 4 and the recall gate electrode 5 as well as on the source 2 formed between the capacitor lower electrode 12 and the selective gate electrode 16, contact holes designated as NC in FIG. 3 are formed. Following this process, polysilicon deposited by CVD method to be filled in the contact holes and also deposited in the thickness of approximately 1000 Å to be laminated as the second conductive layer on the word selective gate electrode 6, the recall gate electrode 5, the floating gate electrode 6, the capacitor lower electrode 12, the selective gate electrode 16 and the above contact holes for patterning into a desired external configuration to form the storage nodes 8, 14.

Figure 4:
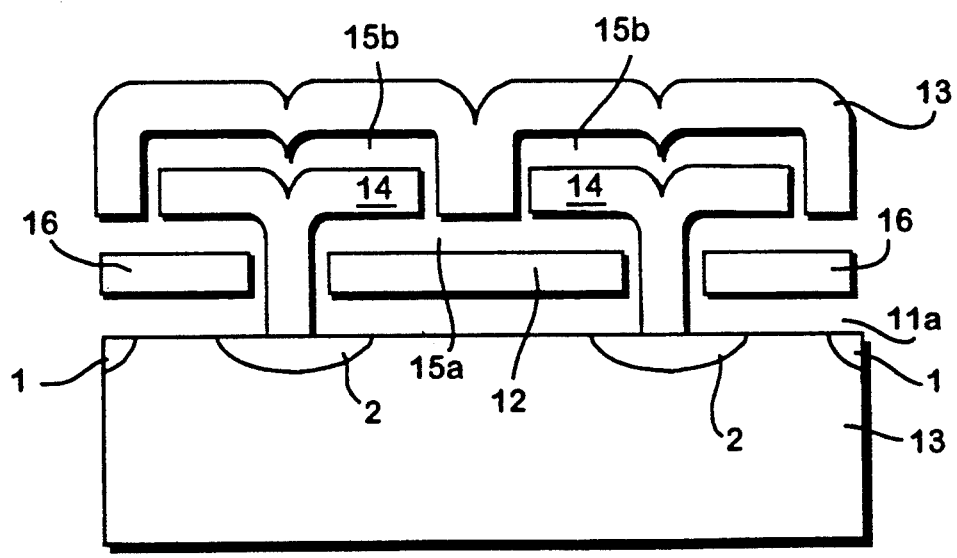
FIG. 4 is an illustrative view showing the construction of the third step in the method for manufacturing the volatile DRAM of the embodiment.

As shown in FIG. 4, in the next process, approximately 150 Å thick $SiO_2$ as the second insulating film is laminated on the storage nodes 8, 14 to form the $SiO_2$ films 9, 15b as capacitor insulating films. Following this step, the approximately 1000 Å thick polysilicon as the third conductive layer are deposited on the $SiO_2$ films 9, 15b to form the capacitor electrode 10 as well as the capacitor upper electrode 13.

Referring to FIGS. 1 and 6, $SiO_2$ is subsequently laminated to the thickness of approximately 3000 to 6000 Å on these devices for forming an interlayer insulating film 11, followed by normal wiring to form simultaneously the non-volatile and the volatile DRAM on the identical substrate.

As mentioned above, the present invention provides a simple method for manufacturing the semiconductor memory. Besides, in the present invention, the non-volatile DRAM acting as both EEPROM and DRAM and the standard DRAM (volatile DRAM) are formed into one chip, the non-volatile DRAM having an identical cell area. The capacitor upper and lower electrodes formed on the both side of the storage node in the volatile DRAM allow the DRAM capacity to be made large.

Consequently, the semiconductor of the present invention can be used as a memory or an ASIC memory in small-size personal apparatuses such as notebook type personal computers, notebook-type word processors, and handy terminals of palm top personal computers. Using these apparatuses, in the operation of DRAM both non-volatile and volatile DRAMs can be used as the same device without distinction. In addition data can be modified at a high speed of 50 nsec/cell. Data in the non-volatile DRAM can be stored even when the power source is turned off.

What is claimed is:

1. A semiconductor memory comprising a plurality of nonvolatile DRAMs and volatile DRAMs overlaying an identical semiconductor substrate, each of the non-volatile DRAMs comprising a word select transistor having a word selective gate electrode, a recall transistor having a recall gate electrode, a Flotox type memory transistor having a floating gate electrode and a capacitor having a storage node and a capacitor electrode, and each of the volatile DRAMs comprising a select transistor having a selective gate electrode and a capacitor having a capacitor lower electrode, a storage node and a capacitor upper electrode;

the word selective gate electrode, the recall gate electrode and the floating gate electrode in the non-volatile DRAM and the selective gate electrode and the capacitor lower electrode in the volatile DRAM being formed of a first conductive layer on the semiconductor substrate, the storage nodes in the non-volatile DRAM and volatile DRAM being formed of a second conductive layer on the first conductive layer, the capacitor electrode in the non-volatile DRAM and the capacitor upper electrode in the volatile DRAM being formed of a third conductive layer on the second conductive layer, and any of the lower electrode and the upper electrode being common to a lower electrode and a upper electrode in their adjacent cells.

2. A semiconductor of claim 1 wherein the first, the second and the third conductive layers are formed of polysilicon.

3. A semiconductor of claim 1 wherein the capacitor lower electrode is formed as a device isolation electrode.

* * * * *